United States Patent [19]
Ohno

[11] Patent Number: 5,891,757
[45] Date of Patent: *Apr. 6, 1999

[54] METHOD FOR FORMING A FIELD-EFFECT TRANSISTOR HAVING DIFFERENCE IN CAPACITANCE BETWEEN SOURCE AND DRAIN WITH RESPECT TO SHIELD LAYER

[75] Inventor: Yasuo Ohno, Tokyo, Japan

[73] Assignee: NEC Corporation, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 748,277

[22] Filed: Nov. 13, 1996

[30] Foreign Application Priority Data

Nov. 30, 1995 [JP] Japan ..................... 7-334299

[51] Int. Cl.$^6$ ............. H01L 21/00; H01L 21/84
[52] U.S. Cl. ............ 438/149; 438/479; 438/526; 438/286
[58] Field of Search ................ 257/347, 349, 257/507; 438/149, 479, 526, 286, 953

[56] References Cited

U.S. PATENT DOCUMENTS

| 4,864,377 | 9/1989 | Widdershoven | 257/347 |
| 4,923,824 | 5/1990 | Fertig et al. . | |
| 5,488,243 | 1/1996 | Tsuruta et al. | 257/347 |
| 5,514,608 | 5/1996 | Williams et al. . | |
| 5,548,150 | 8/1996 | Omura et al | 257/347 |

OTHER PUBLICATIONS

"Suppression of Drain Conductance Transients, Drain Current Oscillations, and Low–Frequency Generation–Recombinatin Noise in GaAs FET's Using Buried Channels" Canfield et al: IEEE Transactions on Electron Devices, vol. ED–33; No. 7; Jul. 1986; pp. 925–928.

"Effects of Neutral Buried p–Layer on High–Frequency Performance of GaAs MESFET's " Onodera et al IEEE Transactions on Electron Devices, vol 38; No. 3; Mar. 1991; pp. 429–436.

"Buried–Channel GaAs MESFET's with Frequency–Independent Output Conductance" Canfield et al IEEE Electron Device LEtters, vol. EDL–8; No. 3; Mar. 1987 pp. 88–89.

Primary Examiner—Jey Tsai
Attorney, Agent, or Firm—Hayes, Soloway, Hennessey Grossman & Hage, PC

[57] ABSTRACT

A field-effect transistor has a source region, a drain region, a gate electrode, and a low resistivity layer. The source and drain regions are of a first conductivity type and formed as surface regions of a semiconductor layer formed on one of an insulating substrate and a semi-insulating substrate. The gate electrode is formed on a channel region between the source region and the drain region. The low resistivity layer serving as a shield layer is disposed underneath and spaced apart from the source, drain and channel regions, and overlaps the source region with an overlap area being larger than an overlap area between the low resistivity layer and the drain region. The arrangement enables the prevention of noise margin reduction and erroneous operation.

6 Claims, 4 Drawing Sheets

METHOD FOR FORMING A FIELD-EFFECT TRANSISTOR HAVING DIFFERENCE IN CAPACITANCE BETWEEN SOURCE AND DRAIN WITH RESPECT TO SHIELD LAYER

BACKGROUND OF THE INVENTION

FIELD OF THE INVENTION

The present invention relates to planer field-effect transistors (FETs) formed n insulating or semi-insulating substrates, and more particularly to field-effect transistor structures which can suppress the influence as much as possible of charging and discharging due, to deep levels introduced into the substrate.

FETs using compound semiconductors such as GaAs and InP are usually fabricated on semi-insulating substrates. One of the reasons for this is that with these semiconductors it is difficult to obtain controlled low carrier concentration substrates due to impurity concentration or naturally occuring crystal defects, and the substrates become semi-insulating unless high concentration impurities are positively added. Another reason is that the semi-insulating substrate is convenient for high speed operation which is a feature of compound semiconductors because the electrostatic capacitance between it and transistors or interconnects is low. For the latter reason, semiconductor devices of silicon, which are required to preform high speed operation, are formed on insulating substrates such as those of $SiO_2$ and sapphire.

The semi-insulating substrate is formed by introducing deep levels. With deep levels, charging and discharging are performed extremely slowly as compared to the transistor operation. With an element formed on silicon on insulator or semiconductor on insulator (hereinafter referred to as SOI), the same effects as above are obtained because interface levels are formed at the interface between the semiconductor and the insulator. This phenomenon poses no substantial problem so long as a single frequency is used. In the case of frequency mixers or in the case where a plurality of frequencies or wide-band signals involving such signals as pulse RF signals and digital signals are used, however, such problems as noise margin reduction and erroneous operation are posed by hysteresis of transistor characteristics. The phenomenon is usually observed as variations of the drain conductance $G_{DS}$ of transistor with frequency. In this specification, the phenomenon will be referred to as frequency dispersion of $G_{DS}$ or merely as frequency dispersion.

The occurrence of the frequency dispersion is attributable to the modulation of the FET current by the slow charging and discharging because of deep levels or interface levels because of the coupling of electric force lines due to the charge at the deep levels or the interface levels with FET channel charge. To solve this problem, it is conceivable to reduce the deep levels or interface levels such that the effects thereof can be ignored or to take the levels to a remote place where the effects can be ignored. In practice, however, a deep level called EL2 is always present in ordinary compound semiconductor substrates and, in SOI, it is difficult to completely eliminate the interface levels even by using thermal oxide films. In order to take the levels to a place remote from the transistor channel, it is necessary to form a high purity, thick epitaxial growth film. However, it is difficult to form a high purity thick layer even by using such epitaxial growth processes as MBE. Therefore, the above method is practically almost infeasible.

Accordingly, it has been proposed to cut electric force lines from the deep levels or interface levels by providing a conductive layer between the channel and the deep levels or interface levels and producing a constant potential on the conductive layer. It is necessary, however, to hold such a shield layer at a constant potential. In other words, shield layer potential variations will constitute variations of transistor current, and thus it is not possible to achieve the intended suppression of the frequency dispersion. It is conceivable to hold the shield layer at a constant potential by making a direct electrical contact to it. The formation of the contact to the shield layer, however, is accompanied by such problems as complication of the fabrication process and chip area increase. Accordingly, a process for an easier method of fixing the shield layer potential is needed.

SUMMARY OF THE INVENTION

The invention was made in view of the foregoing, and an object of the invention, therefore, is to overcome the problems existing in the prior art, and to provide a field-effect transistor in which the potential on the shield layer can be fixed without formation of any contact thereto, and in which the phenomenon of frequency dispersion can be suppressed without giving rise to process complication or chip area increase.

According to one aspect of the invention, there is provided a field-effect transistor comprising:

a source region and a drain region which are of a first conductivity type and formed as surface regions of a semiconductor layer formed on one of an insulating substrate and a semi-insulating substrate;

a gate electrode which is formed on a channel region between the source region and the drain region; and a low resistivity layer which is disposed underneath and spaced apart from the source, drain and channel regions, and which overlaps the source region with an overlap area being larger than an overlap area between the low resistivity layer and the drain region.

The field-effect transistor according to the invention has the low resistivity semiconductor layer as a shield layer, which is formed underneath source and drain regions as well as the channel region so as to produce a difference in the capacitance between the source and drain regions with respect to the shield layer. Thus, according to the invention, there is no need of forming any contact to the shield layer, and it is possible to realize a field-effect transistor, which is not affected by slow current variation due to deep levels or interface levels in a semi-insulating substrate, and in which the operation speed reduction with parasitic capacitance increase due to the provision of the shield layer is minimized.

According to the invention, it is thus possible to provide a high speed transistor, which can prevent erroneous operations of digital circuits due to current variations, ensures stable operations of microwave switches and can prevent noise margin reduction.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Figure 1A:
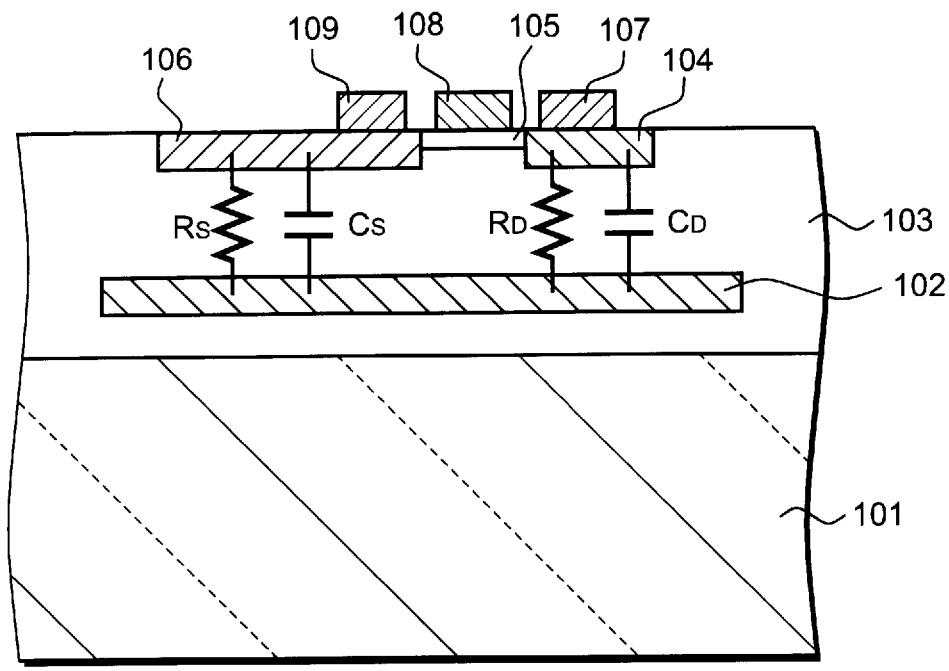
FIGS. 1A and 1B are sectional views of structures for describing the principles underlying the invention.
Figure 1B:
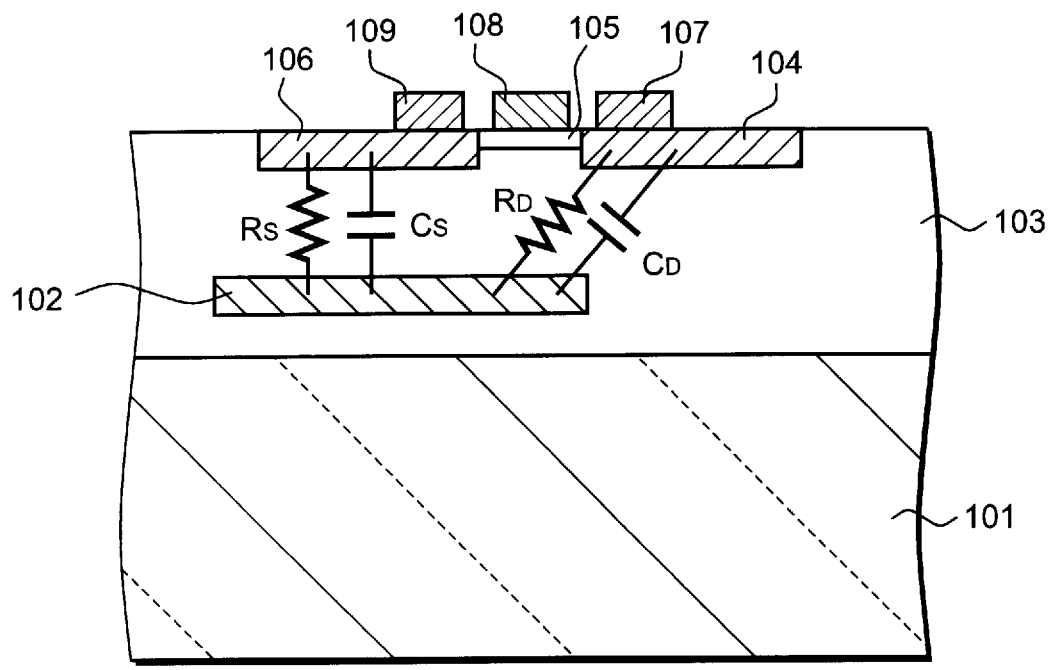

Now, preferred embodiments of the invention are explained with reference to the drawings. FIGS. 1A and 1B are sectional views which are referred to for describing the structure, specifically an MESFET, embodying the invention. Referring to the figures, reference numeral 101 designates a semi-insulating substrate with deep levels, 102 a shield layer of a second conductivity type, for instance, 103 an intrinsic epitaxial layer, 104 a drain region of a first conductivity type, 105 a channel region of the first conductivity type, 106 a source region of the first conductivity type, 107 a drain electrode, 108 a gate electrode, and 109 a source electrode. The first and second conductivity types may be n- and p-types, respectively.

According to the invention, the shield layer 102 is floated from each electrode, and its potential $V_P$ is substantially determined by the potentials on the source and drain regions. As shown in FIG. 1, the potential $V_{PDC}$ in the steady state is given as $$V_{PDC} = \{R_S/(R_S + R_D)\}(V_D - V_S) \quad (1)$$
$$= [(r_S/S_S)/\{(r_S/S_S) + (r_D/S_D)\}] \cdot (V_D - V_S)$$

where $R_D$ is the resistance between the drain region 104 and the shield layer 102, $R_S$ is the resistance between the source region 106 and the shield layer 102, $S_S$ and $S_D$ are the overlap areas of the source and drain regions respectively over the shield layer, $r_S$ and $r_D$ are the resistivities per unit area of the source and drain regions, and $V_S$ and $V_D$ are the source and drain potentials, respectively.

Between the source and drain regions 106 and 104, and the shield layer 102, rectification is provided owing the presence of a p-n junction. Generally, $r_S \ll r_D$, and $V_{PDC}$ is close to $V_S = 0$ V irrespective of the value of $S_S$ or $S_D$.

Under a transient condition, i.e., when the drain voltage is suddenly changed from $V_S = 0$ V to $V_D$, the transient potential $V_{PTR}$ of the shield layer 102 is determined by the capacitances $C_S$ and $C_D$ between the source and drain regions and the shield layer as shown in FIG. 1A. The capacitances $c_S$ and $c_D$ are per unit area. Since $V_{PTR}$ was initially $V_{PTR} = 0$ V, immediately after the drain voltage application it is $$V_{PTR} = \{C_D/(C_S + C_D)\}(V_D - V_S) \quad (2)$$
$$= [(c_D S_D)/\{(c_S S_S) + (c_D S_D)\}](V_D - V_S)$$
$$\approx \{S_D/(S_S + S_D)\}(V_D - V_S)$$

Although a depletion layer is present between the shield layer 102 and the drain region 104, its influence upon the capacitance variation can be ignored because of a large distance of the source and drain regions from the shield layer, and it is possible to consider the capacitances to be $c_S \approx c_D$.

$V_{PTR}$ undergoes a slow transition by the charging and discharging with deep levels, and this transition results in channel current modulation to cause the frequency dispersion. It is thus possible to make the transient potential variation approximately zero by making $S_D/(S_S + S_D)$ approximately zero. This means that it is possible to suppress the frequency dispersion by making the source region area smaller than the drain region area as shown in FIG. 1A or by making the area of the shield layer 102 smaller on the drain side as shown in FIG. 1B. For making the source and drain region areas different, use may be made of the mask pattern which is used when forming the source and drain regions or to the isolation pattern which will be described later.

To reduce the source-drain leakage, the shield layer is preferably of the opposite conductivity type to the conductivity type of the channel. This semiconductor region may be formed by selective ion implantation into the epitaxial layer from above. As an alternative way, after growing the epitaxial layer to a certain extent, the shield layer may be formed selectively by ion implantation or thermal diffusion, followed by forming the remaining portion of the epitaxial layer. When forming the shield layer 102 over the entire area, an impurity is added in an initial or intermediate stage of the step of growing the epitaxial layer 103. In this case, the shield layer can be patterned by selectively ion implanting protons into the epitaxial layer from above, thereby making the unnecessary regions highly resistive. The process of the ion implantation for the resistivity increase may also serve as an isolation process of isolating the source and drain regions from the other region. The isolation process is convenient if the drain region results in a smaller area than the source region. By separating the shield layer for each element, the parasitic capacitance between the shield layer and the interconnects can be reduced. However, a shield layer formed over the entire area may be left without separation. By so doing, although the parasitic capacitance of the interconnects is increased, the potential variations are averaged by the operating states of respective transistors, and the fixing of the shield layer potential can be more effectively obtained.

Since the source is always held essentially at the same potential as the shield layer, increases of $C_S$ do not adversely affect the high speed property of the circuit. However, since the drain potential is varied with respect to the shield layer potential, the increases of $C_D$ are undesired for high speed operation. According to the invention, $C_D$ is held low, and the operation speed reduction due to the provision of the shield layer is minimized.

Some preferred embodiments of the invention will now be described with reference to the drawings.

First Embodiment

Figure 2:
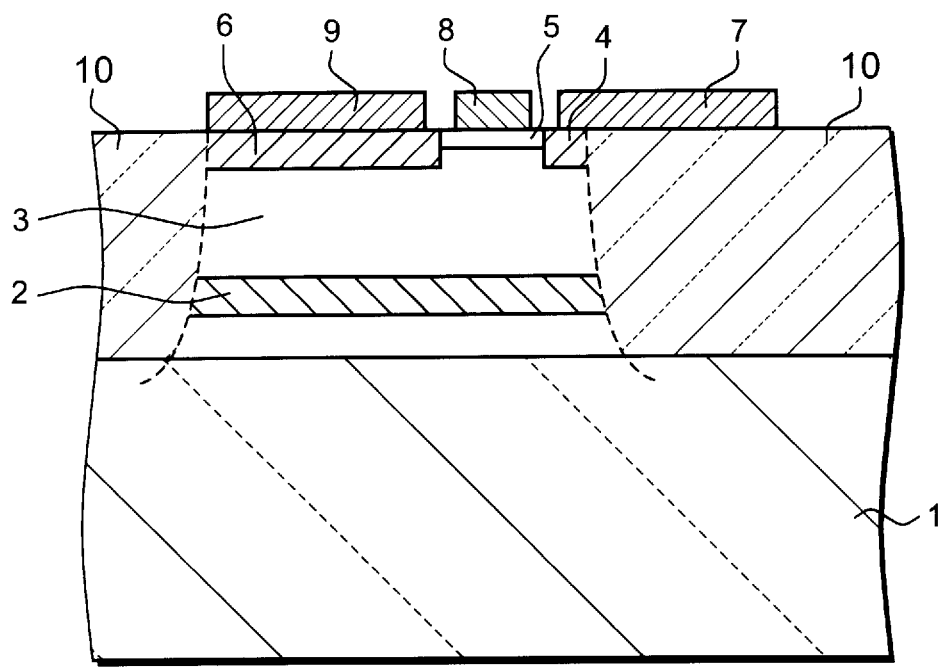
FIG. 2 is a sectional view showing a structure of a first embodiment of the invention.

FIG. 2 is a sectional view showing a first embodiment of the invention. As shown, on a semi-insulating substrate 1, an intrinsic epitaxial layer 3 is formed, and a p-type layer 2 is formed as a shield layer in the epitaxial layer. In the epitaxial layer 3, an n-type drain region 4, an n-type channel region 5 and an n-type source region 6 are formed as surface regions. A drain electrode 7, a gate electrode 8 and a source electrode 9 are formed on the epitaxial layer 3 such that they are in contact with the respective regions 4 to 6. Around this transistor, a semi-insulating region 10 for isolating the transistor from the other regions is formed by ion implantation. The semi-insulating region 10 is formed so as to make the source and drain regions 6 and 4 asymmetric with respect to it, but the drain and source electrodes 7 and 9 are symmetric with respect to the gate electrode 8.

In this embodiment, with the semi-insulating region 10, the p-type layer 2 is made asymmetric with respect to the channel region 5 such that its drain side portion has a smaller area. This structure allows the drain electrode to be made broader than the drain region without increasing $C_D$, thus maintaining the difference between $C_S$ and $C_D$. In this embodiment the area of ohmic contact between the drain region 4 and the drain electrode 7 is reduced compared to the prior art structure. In this portion containing the electrical contact, however, the effective resistance is not substantially increased because the two layers in contact have greatly different resistivities so that current crowding occurs at the end of the portion. The length of the drain region is set to about 1 μm by taking deviations from alignment into considerations. On the other hand, the source region contact length is necessarily about 7 μm. In the case where the drain region has the same length as the source region and fully extends over the p-type layer 2, from equation (2), $V_{PTR}$ is 7 μm/(7 μm+7 μm).$V_D$=½$V_D$. In this embodiment, it is 1 μm/(7 μm+1 μm).$V_D$=⅛ $V_D$, that is, the potential change can be made about ¼.

Second Embodiment

Figure 3:
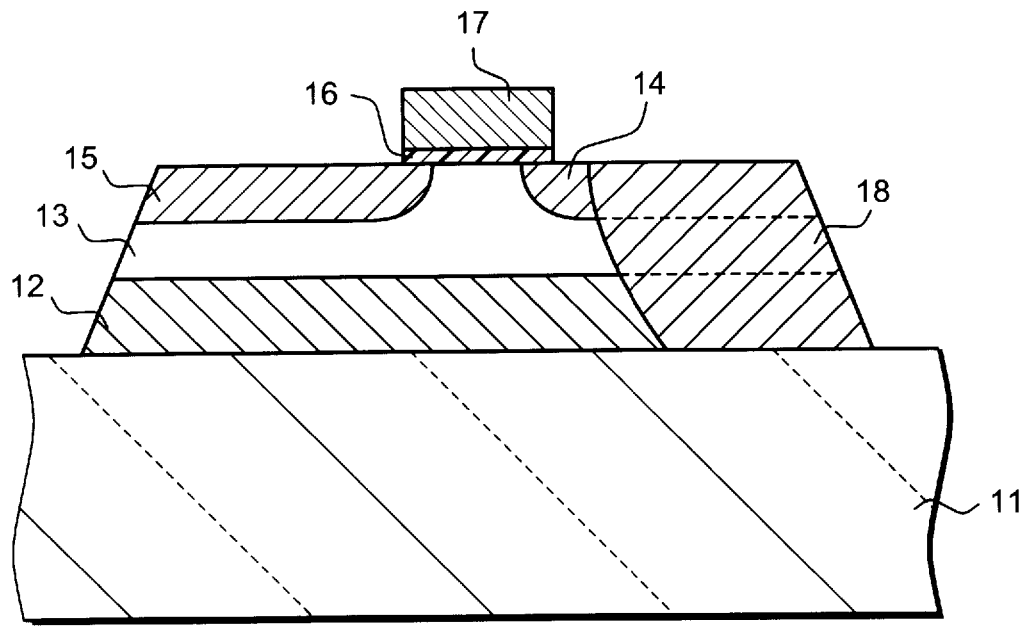
FIG. 3 is a sectional view showing a structure of a second embodiment of the invention.

FIG. 3 is a sectional view showing a second embodiment of the invention. This embodiment concerns a MOS transistor using a SOI substrate. A p-type layer 12 is formed as a shield by an ion implantation process or an epitaxial growth process in a high resistivity semiconductor layer 13 of i-type Si on an insulating substrate 11. A gate electrode 17 is then formed with a gate insulating film 16 interposed on the high resistivity semiconductor layer 13. Then, a drain region 14 and a source region 15 are formed symmetrically by ion implanting an n-type impurity such as phosphorus (P) with the gate electrode 17 used as a mask.

Then, by forming a mask of, for example, photo-resist, an n-type layer 18 reaching the insulating substrate 11 is formed only on the drain side by ion implanting an n-type impurity. Subsequently, an island semiconductor region is formed in a transistor formation region by selectively photo-etching the semiconductor until the insulating substrate 11 is reached. It is possible to perform the island semiconductor region formation step prior to the transistor formation process.

The capacitance $C_D$ is made low compared to $C_S$ with the elimination of the p-type layer 12 as a result of the formation of the n-type layer 18. With this structure, it is thus possible to suppress the frequency dispersion.

Third Embodiment

Figure 4:
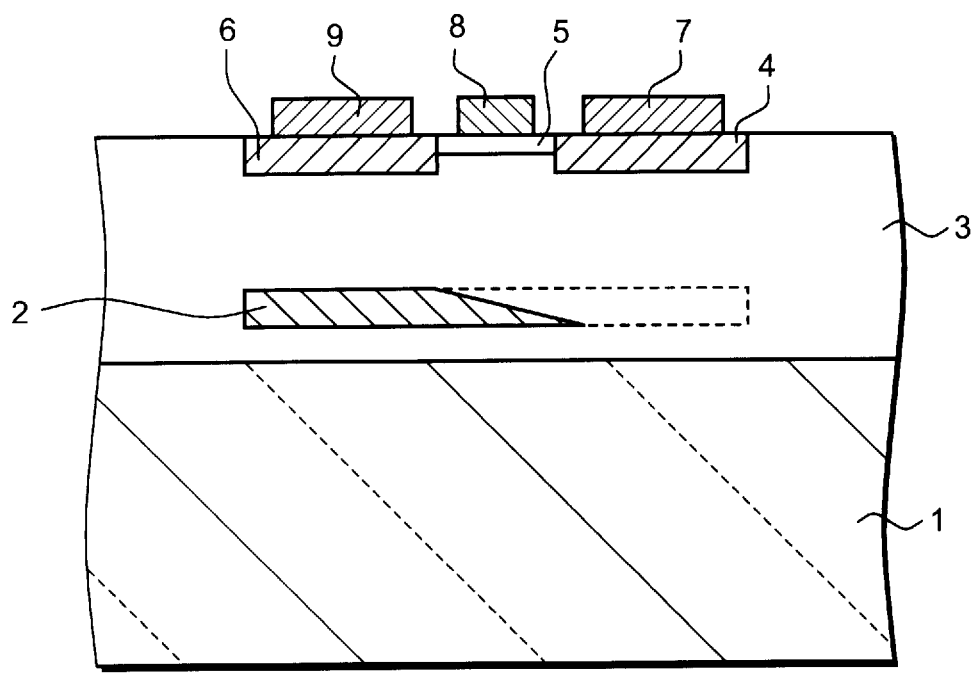
FIG. 4 is a sectional view showing a structure of a third embodiment of the invention.

FIG. 4 is a sectional view showing a third embodiment of the invention. As shown in FIG. 4, this embodiment has a p-type layer 2 formed as a shield layer in an epitaxial layer 3 on an insulating substrate 1, an n-type drain region 4, an n-type channel region 5 and an n-type source region 6 formed in surface region of the epitaxial layer 3 and a drain electrode 7, a gate electrode 8 and a source electrode 9 formed on the epitaxial layer 3. In this embodiment, the p-type layer 2 and the drain and source regions 4 and 6 are formed symmetrically with respect to the channel region 5.

Figure 5:
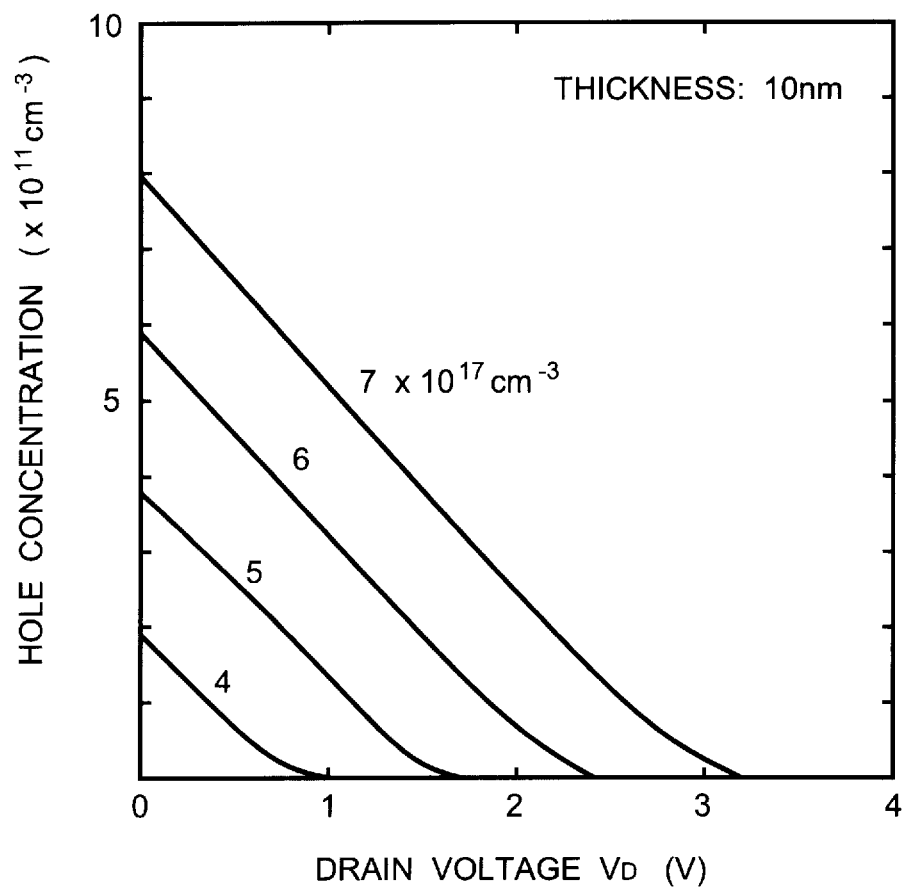
FIG. 5 is a graph showing the relation between drain voltage and p-type layer hole concentration with p-type layer impurity concentration as a parameter.

In this embodiment, the p-type impurity concentration is adjusted to produce a capacitance difference with automatic depletion of the p-type layer 2 caused by the drain voltage. FIG. 5 shows the drain voltage dependency of the hole concentration in a structure with a 10 nm thick p-type layer buried about 500 nm beneath the drain. Since the potential on the p-type layer 2 is essentially equal to the source potential from the p-n junction characteristic, a drain voltage increase causes depletion of the p-type layer.

It can be seen from FIG. 5 that in the case of a p-type layer concentration of 5×10$^{17}$ cm$^{-3}$, the p-type layer is depleted with about 1.5 V or above. When the drain voltage is varied between 2 and 3 V, for instance, the capacitance between the drain and the p-type layer is essentially zero. As for the shielding effect, since the FET current variations are determined by the deep level which is provided underneath the channel region and the shield layer extends up to the center of the channel, a shielding effect is obtained, although it is not perfect.

In the previous first and second embodiments, a difference between the source and drain regions areas is produced, and this required an additional process and an extra mask. To avoid this, in this embodiment, the source and drain regions are formed structurally symmetric, and a capacitance difference is automatically obtained in an electrical operation status. This structure is advantageous in that it can be implemented without need of any mask or process alteration, although the p-type layer impurity concentration control is important.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A method for fabricating a field-effect transistor comprising the steps of:

epitaxially growing a semiconductor layer on one of an insulating substrate and a semi-insulating substrate;

forming a low resistivity layer by adding an impurity in an initial or intermediate stage of said step of epitaxially growing said semiconductor layer;

forming a source region and a drain region on a surface region of said semiconductor layer such that said low resistivity layer has a floating potential with respect to said source and drain regions, said source region and said drain region being of a first conductivity type;

forming a gate electrode on a channel region between said source region and said drain region; and forming, between said low resistivity layer and said source region, an overlap area which is larger than an overlap area formed between said low resistivity layer and said drain region.

2. The method for fabricating the field-effect transistor according to claim 1, in which said step of forming said overlap area comprises a step of forming an ion implanted layer by ion implanting for increasing resistivity of said semiconductor layer such that it extends from surface portion of said semiconductor layer and reaches at least a lower surface of said low resistivity layer.

3. The method for fabricating the field-effect transistor according to claim 2, which further comprises a step of forming a drain electrode in ohmic contact with said drain region and straddling said ion implanted layer.

4. The method for fabricating the field-effect transistor according to claim 1, in which said step of forming said overlap area comprises a step of doping a second conductivity type impurity for resistivity reduction.

5. The method for fabricating the field-effect transistor according to claim 3, in which said step of forming said overlap area comprises a step of positioning a first conductivity type impurity doped layer such that it extends from a surface of said drain region on a side thereof opposite to said channel region and penetrates through said low resistivity layer.

6. The method for fabricating the field-effect transistor according to claim 3, in which said step of forming said overlap area comprises a step of setting an impurity concentration of said low resistivity layer such that a portion of said low resistivity layer at a near side of said drain region is depleted when the transistor is operated, whereby said overlap area between said low resistivity layer and said drain region is made in substance smaller than said overlap area between said low resistivity layer and said source region.

* * * * *